(12) United States Patent
Yin

(10) Patent No.: US 7,526,689 B1
(45) Date of Patent: Apr. 28, 2009

(54) TESTING ADDRESS LINES OF A MEMORY CONTROLLER

(75) Inventor: Robert Yin, Castro Valley, CA (US)

(73) Assignee: Xilinx, Inc., San Jose, CA (US)

( * ) Notice: Subject to any disclaimer, the term of this patent is extended or adjusted under 35 U.S.C. 154(b) by 362 days.

(21) Appl. No.: 11/478,207

(22) Filed: Jun. 29, 2006

Related U.S. Application Data

(62) Division of application No. 10/192,376, filed on Jul. 9, 2002, now Pat. No. 7,085,973.

(51) Int. Cl.
*G11C 29/00* (2006.01)

(52) U.S. Cl. ...................................... 714/718

(58) Field of Classification Search .............. 714/718, 714/725, 724, 733, 735, 736, 719; 326/39, 326/40, 41, 230.05; 702/233
See application file for complete search history.

(56) References Cited

U.S. PATENT DOCUMENTS

| | | | |
|---|---|---|---|
| 4,758,985 A | 7/1988 | Carter | |
| 4,855,669 A | 8/1989 | Mahoney | |
| 4,891,811 A * | 1/1990 | Ash et al. | 714/719 |
| 5,072,418 A | 12/1991 | Boutaud et al. | |
| 5,142,625 A | 8/1992 | Nakai | |
| RE34,363 E | 8/1993 | Freeman | |
| 5,274,570 A | 12/1993 | Izumi et al. | |
| 5,311,114 A | 5/1994 | Sambamurthy et al. | |
| 5,339,262 A | 8/1994 | Rostoker et al. | |
| 5,347,181 A | 9/1994 | Ashby et al. | |
| 5,361,373 A | 11/1994 | Gilson | |
| 5,457,410 A | 10/1995 | Ting | |
| 5,473,267 A | 12/1995 | Stansfield | |
| 5,479,413 A * | 12/1995 | Sicola et al. | 714/718 |

(Continued)

FOREIGN PATENT DOCUMENTS

EP 0315275 A2 10/1989

(Continued)

OTHER PUBLICATIONS

U.S. Appl. No. 09/858,732, filed May 15, 2001, Schultz.

(Continued)

*Primary Examiner*—James C Kerveros
(74) *Attorney, Agent, or Firm*—H. C. Chan; Michael T. Wallace

(57) ABSTRACT

All the address lines in a data processing system can be tested by using one or more small memory device that do not occupy the full addressing capability of the address lines. In one embodiment, some of the address inputs of the memory device is connected to different address lines at different times. Instructions are pre-loaded into some locations of the memory device such that the address lines has to be asserted to fetch the instructions for execution. By executing the instructions and appropriately connecting the address lines to the address input, all the address lines can be tested. In another embodiment, some of the locations are pre-loaded with a set of predetermined values. A program then writes another set of predetermined values to associated locations. By reading the values in the locations and compared with the sets of predetermined values, it is possible to determine if the address lines are functioning properly.

13 Claims, 10 Drawing Sheets

U.S. PATENT DOCUMENTS

| | | | |
|---|---|---|---|
| 5,500,943 A | 3/1996 | Ho et al. |
| 5,504,738 A | 4/1996 | Sambamurthy et al. |
| 5,537,601 A | 7/1996 | Kimura et al. |
| 5,543,640 A | 8/1996 | Sutherland et al. |
| 5,550,782 A | 8/1996 | Cliff et al. |
| 5,552,722 A | 9/1996 | Kean |
| 5,574,930 A | 11/1996 | Halverson, Jr. et al. |
| 5,574,942 A | 11/1996 | Colwell et al. |
| 5,581,745 A | 12/1996 | Muraoka et al. |
| 5,600,845 A | 2/1997 | Gilson |
| 5,640,527 A | 6/1997 | Pecone et al. |
| 5,652,904 A | 7/1997 | Trimberger |
| 5,671,355 A | 9/1997 | Collins |
| 5,705,938 A | 1/1998 | Kean |
| 5,732,250 A | 3/1998 | Bates et al. |
| 5,737,631 A | 4/1998 | Trimberger |
| 5,740,404 A | 4/1998 | Baji |
| 5,742,179 A | 4/1998 | Sasaki |
| 5,742,180 A | 4/1998 | DeHon et al. |
| 5,748,979 A | 5/1998 | Trimberger |
| 5,752,035 A | 5/1998 | Trimberger |
| 5,760,607 A | 6/1998 | Leeds et al. |
| 5,774,409 A | 6/1998 | Yamazaki et al. |
| 5,796,745 A * | 8/1998 | Adams et al. ............... 714/718 |
| 5,809,517 A | 9/1998 | Shimura |
| 5,835,405 A | 11/1998 | Tsui et al. |
| 5,874,834 A | 2/1999 | New |
| 5,889,788 A | 3/1999 | Pressly et al. |
| 5,892,961 A | 4/1999 | Trimberger |
| 5,914,616 A | 6/1999 | Young et al. |
| 5,914,902 A | 6/1999 | Lawrence et al. |
| 5,933,023 A | 8/1999 | Young |
| 5,940,342 A | 8/1999 | Yamazaki et al. |
| 5,970,254 A | 10/1999 | Cooke et al. |
| 5,974,498 A * | 10/1999 | Hopkins ........................ 711/2 |
| 6,011,407 A | 1/2000 | New |
| 6,020,755 A | 2/2000 | Andrews et al. |
| 6,026,481 A | 2/2000 | New et al. |
| 6,031,391 A | 2/2000 | Couts-Martin et al. |
| 6,096,091 A | 8/2000 | Hartmann |
| 6,154,051 A | 11/2000 | Nguyen et al. |
| 6,163,166 A | 12/2000 | Bielby et al. |
| 6,172,990 B1 | 1/2001 | Deb et al. |
| 6,178,541 B1 | 1/2001 | Joly et al. |
| 6,181,163 B1 | 1/2001 | Agrawal et al. |
| 6,191,998 B1 * | 2/2001 | Reddy et al. ............ 365/230.05 |
| 6,211,697 B1 | 4/2001 | Lien et al. |
| 6,242,945 B1 | 6/2001 | New |
| 6,272,451 B1 | 8/2001 | Mason et al. |
| 6,279,045 B1 | 8/2001 | Muthujumaraswathy et al. |
| 6,282,627 B1 | 8/2001 | Wong et al. |
| 6,301,696 B1 | 10/2001 | Lien et al. |
| 6,343,207 B1 | 1/2002 | Hessel et al. |
| 6,353,331 B1 | 3/2002 | Shimanek |
| 6,356,987 B1 | 3/2002 | Aulas |
| 6,389,558 B1 | 5/2002 | Herrmann et al. |
| 6,434,735 B1 | 8/2002 | Watkins |
| 6,460,172 B1 | 10/2002 | Farre et al. |
| 6,467,009 B1 | 10/2002 | Winegarden et al. |
| 6,483,342 B2 | 11/2002 | Britton et al. |
| 6,507,942 B1 | 1/2003 | Calderone et al. |
| 6,510,548 B1 | 1/2003 | Squires |
| 6,518,787 B1 | 2/2003 | Allegrucci et al. |
| 6,519,753 B1 | 2/2003 | Ang |
| 6,522,167 B1 | 2/2003 | Ansari et al. |
| 6,532,572 B1 | 3/2003 | Tetelbaum |
| 6,539,508 B1 | 3/2003 | Patrie et al. |
| 6,541,991 B1 | 4/2003 | Hornchek et al. |
| 6,542,969 B1 | 4/2003 | Sato |
| 6,578,174 B2 | 6/2003 | Zizzo |
| 6,587,995 B1 | 7/2003 | Duboc et al. |
| 6,588,006 B1 | 7/2003 | Watkins |
| 6,601,227 B1 | 7/2003 | Trimberger |
| 6,604,228 B1 | 8/2003 | Patel et al. |
| 6,611,951 B1 | 8/2003 | Tetelbaum et al. |
| 6,662,285 B1 | 12/2003 | Douglass et al. |
| 6,781,407 B2 | 8/2004 | Schultz |
| 6,798,239 B2 | 9/2004 | Douglass et al. |
| 6,886,092 B1 | 4/2005 | Douglass et al. |
| 6,983,405 B1 | 1/2006 | Herron et al. |
| 6,996,758 B1 | 2/2006 | Herron et al. |
| 7,076,595 B1 | 7/2006 | Dao et al. |
| 7,149,939 B2 * | 12/2006 | Michael ...................... 714/719 |
| 2001/0049813 A1 | 12/2001 | Chan et al. |
| 2002/0023197 A1 | 2/2002 | Miura et al. |
| 2003/0167428 A1* | 9/2003 | Gold .......................... 714/720 |

FOREIGN PATENT DOCUMENTS

| | | |
|---|---|---|
| EP | 0 905 906 A2 | 3/1999 |
| EP | 1 235 351 A1 | 8/2002 |
| WO | WO 93 25968 A1 | 12/1993 |

OTHER PUBLICATIONS

Sayfe Kiaei et al.; "VLSI Design of Dynamically Reconfigurable Array Processor-Drap," IEEE; Feb. 1989; V3.6, IEEE; 3 Park Avenue, 17th Floor, New York, NY 10016-5997; pp. 2484-2488.

Vason P. Srini; "Field Programmable Gate Array (FPGA) Implementation of Digital Sytems: An Alternative to ASIC"; IEEE; May 1991; IEEE; 3 Park Avenue, 17th Floor, New York, NY 10016-5997; pp. 309-314.

G. Maki et al.; "A Reconfigurable Data Path Processor"; IEEE; Aug. 1991; IEEE; 3 Park Avenue, 17th Floor, New York, NY 10016-5997; pp. 18-4.1 to 18-4.4.

Jacob Davidson; "FPGA Implementation of Reconfigurable Microprocessor"; IEEE; Mar. 1993; IEEE, 3 Park Avenue, 17th Floor, New York, NY 10016-5997; pp. 3.2.1-3.2.4.

Christian Iseli et al.; "Beyond Superscaler Using FPGA's"; IEEE; Apr. 1993; 3 Park Avenue, 17th Floor, New York, NY 10016-5997; pp. 486-490.

P.C. French et al.; "A Self-Reconfiguring Processor"; IEEE; Jul. 1993; 3 Park Avenue, 17th Floor, New York, NY 10016-5997; pp. 50-59.

Christian Iseli et al., "SPYDER: A Reconfigurable VLIW Processor Using FPGA's"; IEEE; Jul. 1993; 3 Park Avenue, 17th Floor, New York, NY 10016-5997; pp. 17-24.

Michael J. Wirthlin et al.; "The NANO Processor: A Low Resource Reconfigurable Processor"; IEEE; Feb. 1994; 3 Park Avenue, 17th Floor, New York, NY 10016-5997; pp. 23-30.

William S. Carter, "The Future of Programmable Logic and Its Impact on Digital System Design"; Apr. 1994; IEEE; 3 Park Avenue, 17th Floor, New York, NY 10016-5997; pp. 10-16.

Andre' DeHon; "DPGA-Coupled Microprocessors: Commodity ICs for the Early 21st Century"; IEEE; Feb. 1994; IEEE; 3 Park Avenue, 17th Floor, New York, NY 10016-5997; pp. 31-39.

Osama T. Albaharna; "Area & Time Limitations of FPGA-Based Virtual Hardware"; IEEE; Apr. 1994; 3 Park Avenue, 17th Floor, New York, NY 10016-5997; pp. 184-189.

Xilinx, Inc.; "The Programmable Logic Data Book"; 1994; Revised 1995; available from Xilinx, Inc., 2100 Logic Drive, San Jose, California 95124.

International Business Machines; "Processor Local Bus"; Architecture Specifications; 32-Bit Implementation; Apr. 2000; First Edition; V2.9; IBM Corporation, Department H83A, P.O. Box 12195, Research Triangle Park, NC 27709; pp. 1-76.

Xilinx, Inc.; Virtex II Platform FPGA Handbook, Dec. 6, 2000, v1.1; available from Xilinx, Inc., 2100 Logic Drive, San Jose, California 95124; pp. 33-75.

Xilinx, Inc.; "The Programmable Logic Data Book"; Copyright 2000, Chapter 3; available from Xilinx, Inc., 2100 Logic Drive, San Jose, CA. 95124; pp. 3-1 to 3-117.

Christian Iseli et al.; "AC++ Compiler for FPGA Custom Execution Units Synthesis"; 1995; IEEE; 3 Park Avenue, 17th Floor, New York, NY 10016-5997; pp. 173-179.

International Business Machines; "PowerPC 405 Embedded Processor Core User Manual," 1996; 5th Ed., International Business Machines; 1580 Rout 52, Bldg. 504, Hopewell Junction, NY 12533-6531; pp. 1-1 to X-16.

Yamin Li et al.; "AIZUP-A Pipelined Processor Design and Implementation on Xilinx FPGA Chip"; IEEE; Sep. 1996; IEEE; 3 Park Avenue, 17th Floor, New York, NY 10016-5997; pp. 98-106, 98-106.

Ralph D. Wittig et al.; ONECHIP: An FPGA Processor with Reconfigurable Logic; Apr. 17, 1996; IEEE; 3 Park Avenue, 17th Floor, New York, NY 10016-5997; pp. 126-135.

Xilinx, Inc.; "The Programmable Logic Data Book"; Jan. 27, 1999; Ch. 3, available from Xilinx, Inc., 2100 Logic Drive, San Jose, CA 95124; pp. 3-1 to 3-50.

William B. Andrew et al.; "A Field Programmable System Chip Which Combines FPGA and ASIC Circuitry"; IEEE; May 16, 1999; IEEE; 3 Park Avenue, 17th Floor, New York, NY 10016-5997; pp. 183-186.

Cary D. Snyder et al.; "Xilinx's A-to-Z System Platform"; Cahners Microprocessor; The Insider's Guide to Microprocessor Hardware; Microdesign Resources; Feb. 6, 2001; pp. 1-5.

* cited by examiner

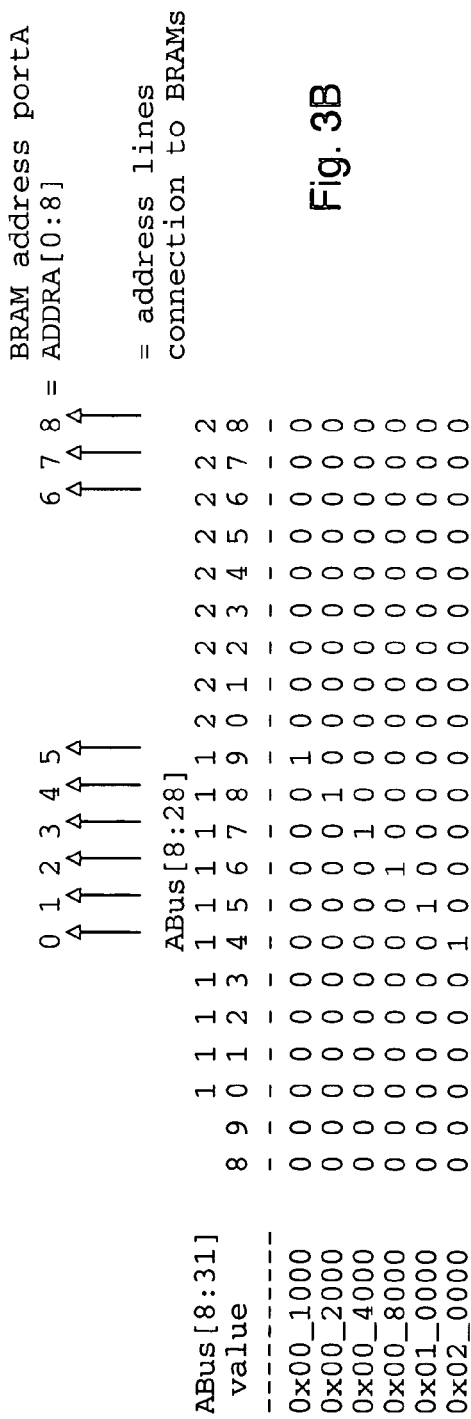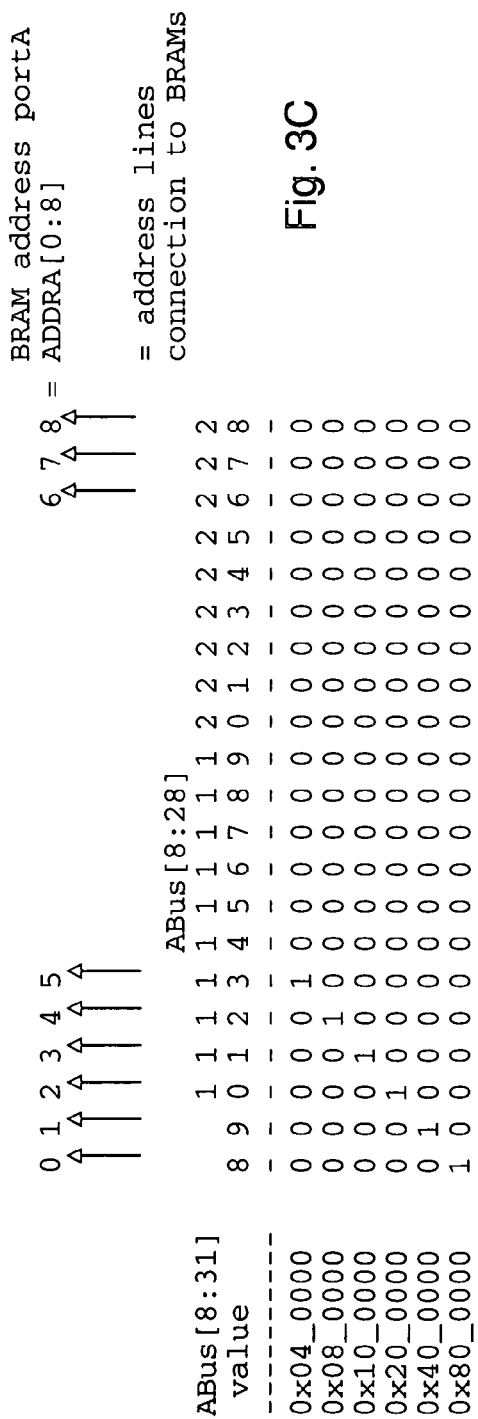

| ABus[8:31] value | test program instruction | | | comment |
|---|---|---|---|---|
| 0x0 | addi | r12, | r12, 1 | for checking the number of Addr space regions visited |
| 0x4 | addis | r23, | 0, iocmrtn@h | ISOCM starting address |
| 0x8 | ori | r23, | r23, iocmrtn@l | |
| 0xc | addi | r23, | r23, 0x20 | Addr of next Addr region to jump to |
| 0x10 | mtctr | r23 | | load target Addr to Count Reg for indirectly addressed branching |
| 0x14 | bctr | | | branch to next instruction group |
| 0x18 | | | | no instruction in this Addr |
| 0x1c | | | | no instruction in this Addr |
| 0x20 | addi | r12, | r12, 1 | |
| 0x24 | addis | r23, | 0, iocmrtn@h | |
| 0x28 | ori | r23, | r23, iocmrtn@l | |
| 0x2c | addi | r23, | r23, 0x40 | |
| 0x30 | mtctr | r23 | | |
| 0x34 | bctr | | | |
| 0x38 | | | | |
| 0x3c | | | | |
| 0x40 | addi | r12, | r12, 1 | |
| 0x44 | addis | r23, | 0, iocmrtn@h | |
| 0x48 | ori | r23, | r23, iocmrtn@l | |
| 0x4c | addi | r23, | r23, 0x80 | |
| 0x50 | mtctr | r23 | | |
| 0x54 | bctr | | | branch to next Addr region |
| 0x58 | | | | |

Fig. 4A

```
0x5C
0x60
0x64
0x68
0x6C
0x70
0x74
0x78
0x7C
0x80    addi    r12, r12, 1
0x84    addis   r23, 0, iocmrtn@h
0x88    ori     r23, r23, iocmrtn@l
0x8C    addi    r23, r23, 0x80
0x90    mtctr   r23
0x94    bctr                        branch to next Addr region
0x98
0x9C
...
```

Fig. 4B

```
.section   ocm_data, data
ocm_data1:
        .long    0xa1b1c1d1        ! 1st 1K byte page
        .long    0x00101001        !   0x0        (hex)
        .long    0x00202002        !   0x4
                                   !   0x8
        .long    0x00404004        !   0x10
        .long    0x00808008        !   0x20
        .long    0x01610016        !   0x40
        .long    0x03220032        !   0x80
        .long    0x06440064        !   0x100
        .long    0x12880128        !   0x200
        .align   10
ocm_data2:                         ! 2nd 1K byte page
        .long    0xa2b2c2d2        !   0x400
        .align   10
ocm_data3:                         ! 3rd 1K byte page
        .long    0xa3b3c3d3        !   0x800
        .align   11
ocm_data4:                         ! 4th 1K byte page
        .long    0xa4b4c4d4        !   0x1000
```

Fig. 7

TESTING ADDRESS LINES OF A MEMORY CONTROLLER

FIELD OF THE INVENTION

The present invention relates to memory systems, and more particularly to testing of address lines without requiring the presence of memory devices addressable by all the address lines.

BACKGROUND OF THE INVENTION

Many data processing systems contains a memory controller, which is an electronic component that assists a processor to interface with random access memory (RAM) devices. Typically, a memory controller controls a number of address lines, which defines the maximum amount of addressable memory. In order to make sure that the memory controller works properly, the full addressing capacity need to be tested. In conventional testing, the memory controller is connected to memory devices that span the maximum addressable memory. This allows the testing of the full addressing capacity.

In advanced systems, the amount of addressable memory is large. In some situations, it may be very difficult to have memory devices that occupy the full span. One example of such a situation can be found in system-on-a-chip (SoC) devices that contain a processor, memory, and input-output peripherals. The amount of physical memory in the SoC is generally much less than the maximum addressable memory of the processor. Even though it may be possible to attach external memory devices to the SoC, it is desirable to conduct all testing within the SoC.

Consequently, there is a need for a new method of testing that does not requires large amount of memory.

SUMMARY OF THE INVENTION

One embodiment of the present invention is a system for testing a set of address lines. The set of address lines has a first group (e.g., the least significant group) and a second group. The second group is further divided into a number of subgroups. At least one memory device is used. It has a first set of address inputs and a second set of address inputs. The first set of address inputs (e.g., the least significant bits) is connected to the first group of address lines. The second set of address inputs (e.g., the rest of the address inputs of the memory device) is connected to separate subgroups at different times. A program is stored in the memory device and accessible by using the first set of address input. Thus, all the subgroups can access the program. The program contains instructions that branch from one subgroup to a different subgroup. After all the subgroups are accessed, all the address lines are tested.

In another embodiment of the present invention the set of address lines having at least a first group and a second group. At least one memory device has a set of address inputs that is connected to the first group and the second group at different times. A program pre-loads a first set of predetermined data into a first set of locations of the memory device and writes a second set of predetermined data into a second set of locations that is associated with the first set of locations. The first and second sets of locations are chosen such that each of the set of address inputs is exercised in accessing the first and the second sets of locations. The program further reads the first and second sets of locations to determine if they are correctly accessed by using the first and the second sets of predetermined data.

The above summary of the present invention is not intended to describe each disclosed embodiment of the present invention. The figures and detailed description that follow provide additional example embodiments and aspects of the present invention.

BRIEF DESCRIPTION OF THE DRAWINGS

FIGS. 3A-3C show the relationship between the address lines of the system in FIG. 2.

FIGS. 4A-4B show an exemplary code segment of test instructions of the present invention.

FIG. 7 shows an exemplary memory map and data values of selected address locations in accordance with the present invention.

DETAILED DESCRIPTION OF THE INVENTION

The present invention relates to a new method for testing address lines. In the following description, numerous specific details are set forth in order to provide a more thorough understanding of the present invention. However, it will be apparent to one skilled in the art that the present invention may be practiced without these specific details. In other instances, well-known features have not been described in detail in order to avoid obscuring the present invention.

Figure 1:
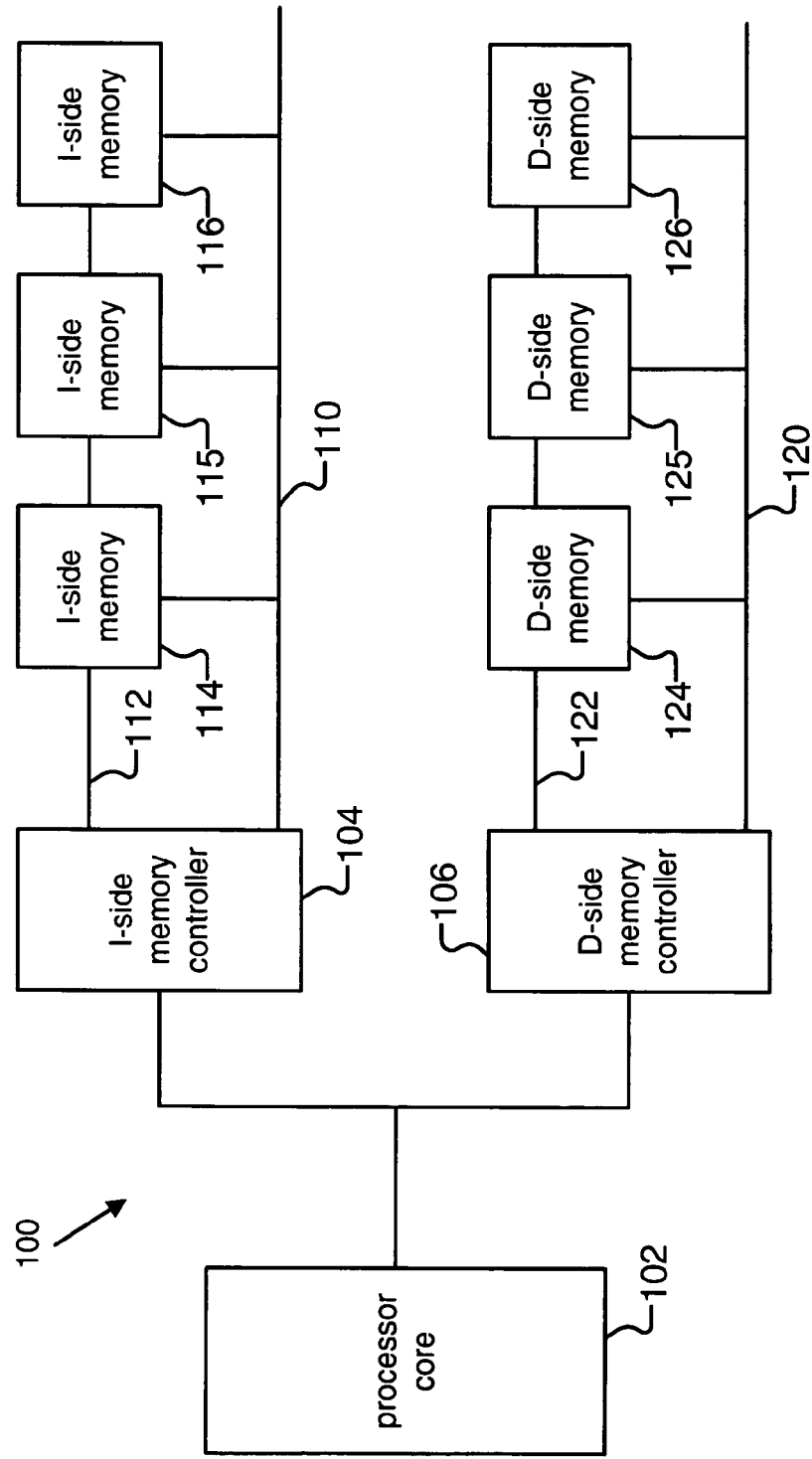
FIG. 1 is a block diagram showing a data processing system in which the present invention can be used.

FIG. 1 is a block diagram showing a system 100 in which the present invention can be used. System 100 contains a processor core 102, an instruction-side memory controller 104, and a data-side memory controller 106. Instruction-side memory controller 104 controls an address bus 110 and a data bus 112 that are connected to a plurality of memory devices 114-116. Similarly, data-side memory controller 106 controls an address bus 120 and a data bus 122 that are connected to a plurality of memory devices 124-126.

System 100 can be implemented in a field programmable gate array (FPGA). For example, Xilinx, Inc. recently announced a new FPGA, the Virtex-II Pro, that contains a processor core (comprising a PowerPC core), an instruction-side on-chip memory (ISOCM) controller, a data-side on-chip memory (DSOCM) controller, a plurality of block random access memory (BRAM), and a plurality of high speed transceivers. The ISOCM and DSOCM controllers can each interface with 22-bit address buses, which means that the they can address up to a maximum of 16 MBytes of on-chip memory. However, the amount of BRAM in the FPGA is much less than 16 MBytes. Consequently, it is difficult to test the ISOCM and DSOCM controllers using conventional methods.

In one version of the Virtex-II Pro, the most significant 8 bits, address [0:7], are used to select the address space, and the remaining 22 bits, address [8:29], are used to access the on-chip memory in those address space. It should be note that other types of integrated circuits may have different architecture.

Figure 2:
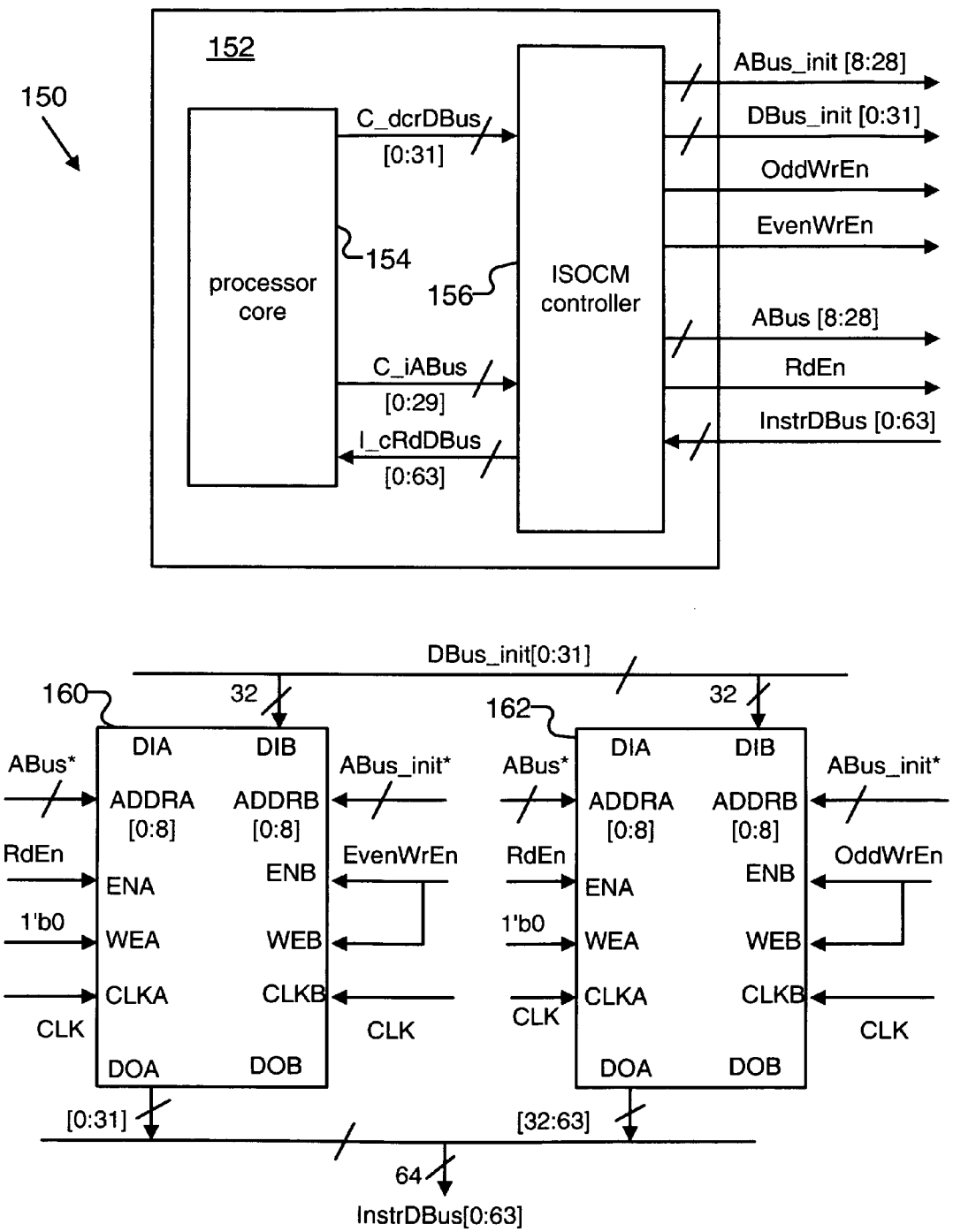
FIG. 2 is a block diagram showing the instruction-side of a data processing system of the present invention.

The present invention uses memory devices that span a subset of the addressable capacity, but allows the full capacity to be tested. In the present invention, the instruction-side and data-side are treated differently. In order to illustrate the present invention, the architecture of the Virtex-II Pro is used. FIG. 2 is a block diagram showing the instruction-side 150 of a data processing system. It contains a processor subsystem 152 that includes a processor core 154 and an ISOCM controller 156. Processor core 154 and ISOCM controller 156 communicate with each other through a set of signals, such as C_dcrDBus, C_iABus, and I_cRdDBus. The bus C_dcrDBus is a device control register data bus that allows the processor core to write data into registers of peripheral units (such as ISOCM controller 156) that reside on-chip. The bus C_iABus is an address bus that the processor core uses to deliver the address to ISOCM controller 156 to fetch the needed instruction from the on-chip memory. The bus I_cRdDBus is the data bus that the ISOCM controller 156 uses to deliver requested instructions to the processor core from the On-chip memory.

ISOCM controller 156 generates another set of signals for controlling the operation of its associated memory devices (such as memory devices 160 and 162). Examples of the signals are ABus_init, DBus_init, OddWrEn, EvenWrEn, ABus, and InstrDbus. In one embodiment, ISOCM controller 156 has a data width of 64 bits. The bus ABus_init is the address bus that the ISOCM controller uses to initialize the on-chip memory with instructions under user's (test) program control. DBus_init is the data bus that ISOCM controller 156 uses to write instructions to on-chip memory to initialize the on-chip memory with instructions under user's (test) Program Control. The signal OddWrEn is a signal that ISOCM controller 156 uses to write instructions to the odd word (bits [32:63]) of the on-chip memory. The signal EvenWrEn is a signal that ISOCM controller 156 uses to write instructions to the even word (bits [0:31]) of the On-chip memory. The bus ABus is an address bus that ISOCM controller 156 uses to fetch instructions from the on-chip memory. The bus InstrDBus is a data bus that carries the pair of instructions fetched from the BRAMs.

In instruction-side 150, each of memory devices 160 and 162 is a two-port device (designated ports A and B). As an example, each memory device can be a 512×32 bit BRAM. They are connected together to form a double word, as required by the exemplary 64-bit ISOCM controller of FIG. 2. Note that if the ISOCM controller or the memory device has a different data width, the number of memory devices can be different from two. Each port contains a 9-bit address bus (ADDR), a data in (DI), a data out (DO), an enable (EN), a write enable (WE), and a clock (CLK) signal. The 9-bit address bus is used to address 512 memory locations in the 512×32 bits BRAM. In FIG. 2, the letters "A" and "B" are attached to the signals to indicate that the signals belong to the "A" and "B" port, respectively.

In FIG. 2, the RdEn output of ISOCM controller 156 is connected to the ENA input of BRAM 160 and BRAM 162. The EvenWrEn output of ISOCM controller 156 is connected to the ENB and WEB inputs of BRAM 160. The OddWrEn output of ISOCM controller 156 is connected to the ENB and WEB inputs of BRAM 162. The WEA inputs of BRAMs 160 and 162 are set at a fixed value (in this case, 1'b0). The DIB inputs of BRAM 160 and BRAM 162 are used to accept test program instruction during an initialization process. The DOA outputs of BRAM 160 and BRAM 162 are combined to provide a 64-bit bus for test program execution. Each of the ports of BRAMs 160 and 162 contains a clock (CLK) input. They are connected to the clock signal intended for controlling the operation of memory devices of the data processing system. In one embodiment in which the integrated circuit is a FPGA, the CLK signal is generated by a digital clock manager in the FPGA.

The connection between the ABus_init and ABus buses of ISOCOM 156 and the BRAMs depend on the addresses being tested. To test each address line bit of ABus[8:28] of ISOCM controller 156, the address lines to the BRAMs are connected in three distinct groups, ABus[8:13], ABus[14:19], and ABus [20:28], and three separate test programs are applied. To test address line bits of ABus[20:28] in test program 1, the address lines are connected to ADDRA[0:8] of BRAMs 160 and 162. To test address line bits of ABus[14:19] in test program 2, the address lines ABus[14:19] are connected to ADDRA[0:5] of BRAMs 160 and 162 and address lines ABus[26:28] are connected to ADDRA[6:8] of BRAMs 160 and 162. To test address line bits of ABus[8:13] in test program 3, the address lines ABus[8:13] are connected to ADDRA[0:5] of BRAMs 160 and 162 and address lines ABus[26:28] are connected to ADDRA[6:8] of BRAMs 160 and 162.

A table is provided to illustrate the relationship between the connection of ADDRA (shown as ABus* in FIG. 2) and the test programs:

Test 1: ABus[20:28];
Test 2: {ABus[14:19],ABus[26:28]}; and
Test 3 {ABus[8:13], ABus[26:28]}.

Similarly, a table is provided to illustrate the relationship between the connection of ADDRB (shown as ABus_init* in FIG. 2) and the test programs:

Test 1: ABus_init[20:28];
Test 2: {ABus_init[14:19],ABus_init[26:28]}; and
Test 3 {ABus_init[8:13], ABus_init[26:28]}.

If instruction-side 150 is implemented in a FPGA, the connection between the ADDRA and ADDRB ports of the BRAMs and the ABus and ABus_init buses of the ISOCM controller can be configured separately in each of the three tests. Thus, a new configuration is performed before running each test. As a result, there is no need to use extra circuitry in the connection. If the implementation is conducted on a non-programmable device, switching circuit elements (e.g., multiplexers) can be used to implement the different connections.

To verify that the address lines are operating properly, each address line bit needs to be toggled. In one embodiment, program instructions are pre-load into different address space regions of BRAMs 160 and 162. The address lines of the BRAMs and ISOCM controller 156 are connected in the innovative way described above. The address lines are asserted to fetch those instructions for execution. If an address line bit is defective or stucked in a deasserted state, the test program cannot fetch the required instruction for execution, thereby causing test failure. On the other hand, if an address line bit is stucked at an asserted state, then the test program is fetching instruction from a wrong address or undefined memory location, again causing failure in the test. Thus, this embodiment consists of a combination of address bus connection scheme in hardware and associated test program in software.

Figure 3A:
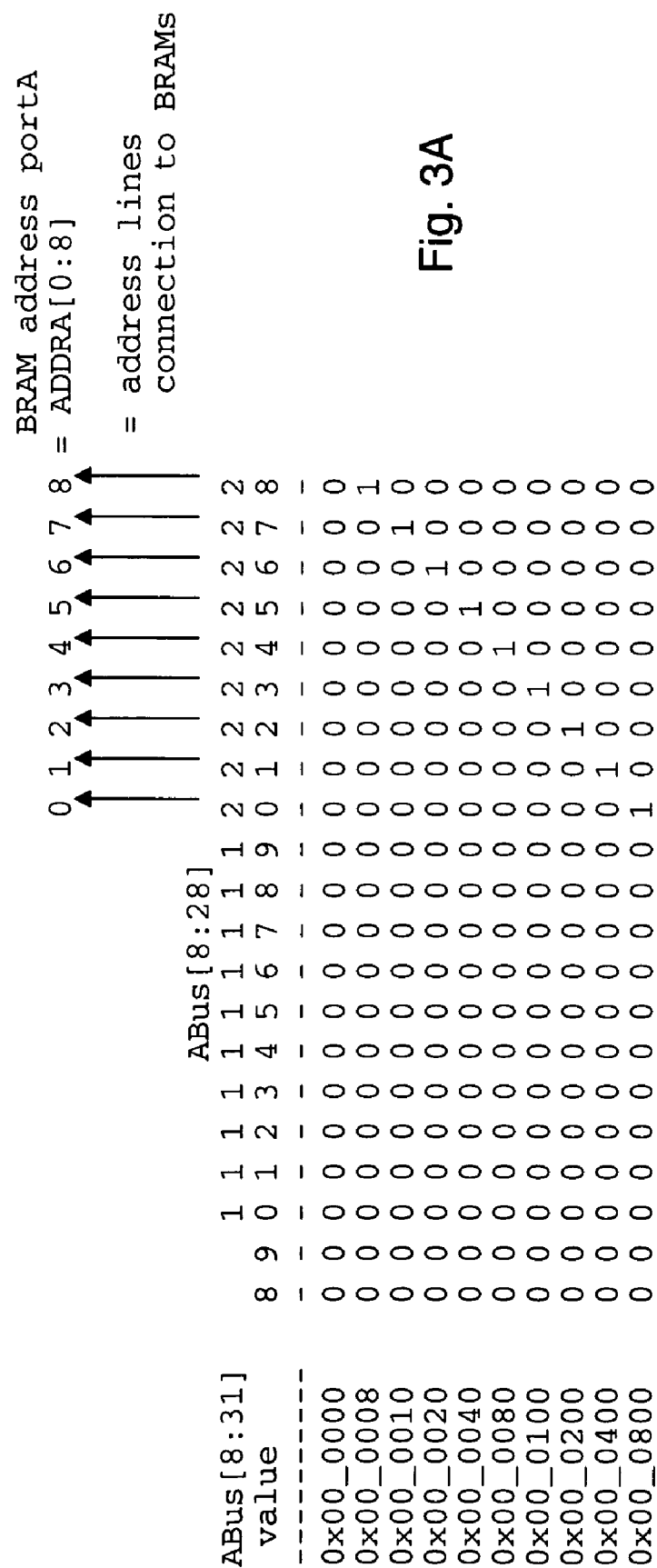

In operation, processor core 154 first initializes BRAMs 160 and 162 by sending test instructions to ISOCM controller 156 via a device control register bus C_dcrDBus[0:31]. ISOCM controller 156 then generates the necessary address and control signals (ABus_init[8:28], OddWrEn and EvenWrEn) and writes those test instructions into BRAMs 160 and 162 through DBus_init[0:31]. After initializing the BRAMs, the test program branches to ISOCM address space and starts executions instructions fetched from the BRAMs. The test instructions stored in each address space region in BRAMs 160 and 162 basically directs the test program to branch from one address space region to another address space region, creating the effect of toggling the next higher significant bit of the address line. In conjunction with the address line connections described above in connection with FIG. 2, the three test programs toggle the address line bits one by one as shown in FIGS. 3A-3C. These three figures show the correspondence between the address lines connection to BRAMs 160 and 162 (ABus[8:28] and ADDRA[0:8]) and the test program instructions exercising the address line bits (Abus[8:28] values). Note that not all address line bits exercised by the test program is shown in the figures. Only those that are used for illustration are shown.

If instruction-side 150 is implemented on a FPGA, the test instructions can be pre-loaded into the BRAMs during the configuration of the FPGA at power-up. In this case, there is no need to pre-load through ISOCM controller 156 using the device control register bus.

An exemplary code fragment of the test instructions contained in the address space regions in BRAMs is illustrated in FIG. 4A (addresses 0x0 to 0x5b) and FIG. 4B (addresses 0x5c upward). Because the least significant 3 bits of address lines ABus[26:28] are always connected to the last 3 bits of the BRAM address ports ADDRA[6:8], each address region reserves up to a maximum of 16 instructions for test routines. The three address space regions shown in FIGS. 4A and 4B are 0x0-0x3c, 0x40-0x7c, and 0x80-0xbc.

In FIGS. 4A and 4B, the following symbols represent:

"addi" (Add Immediate): The format is "addi RT, RA, IM". The contents of register RA is added to contents of IM field and the sum, sign-extended to 32-bits, is placed into register RT.

"addis" (Add Immediate Shifted): The format is "addis RT,RA, IM". When RA is 0, the contents of IM field is shifted to the left most 16 significant bits and the right is concatenated with 16 0-bits. The result is placed into register RT.

"ori" (OR Immediate): The format is "ori RA, RS, IM". An extended IM field is formed by concatenating 16 0-bits to the left with IM field. Register RS is ORed with the extended IM field, and the result is placed into register RA.

"mtctr" (Move to Count (CTR) Register): The format is "mtctr RS". The contents of register RS are placed into CTR register.

"bctr" (Branch): The format is "bctr". Branch unconditionally to address in CTR register.

Figure 5:
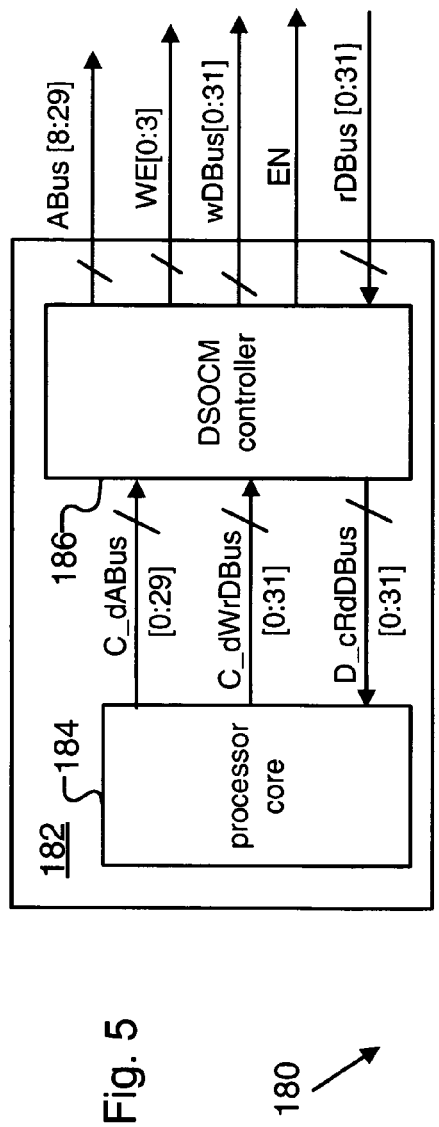
FIG. 5 is a block diagram showing the data-side of a data processing system of the present invention.
Figure 5:
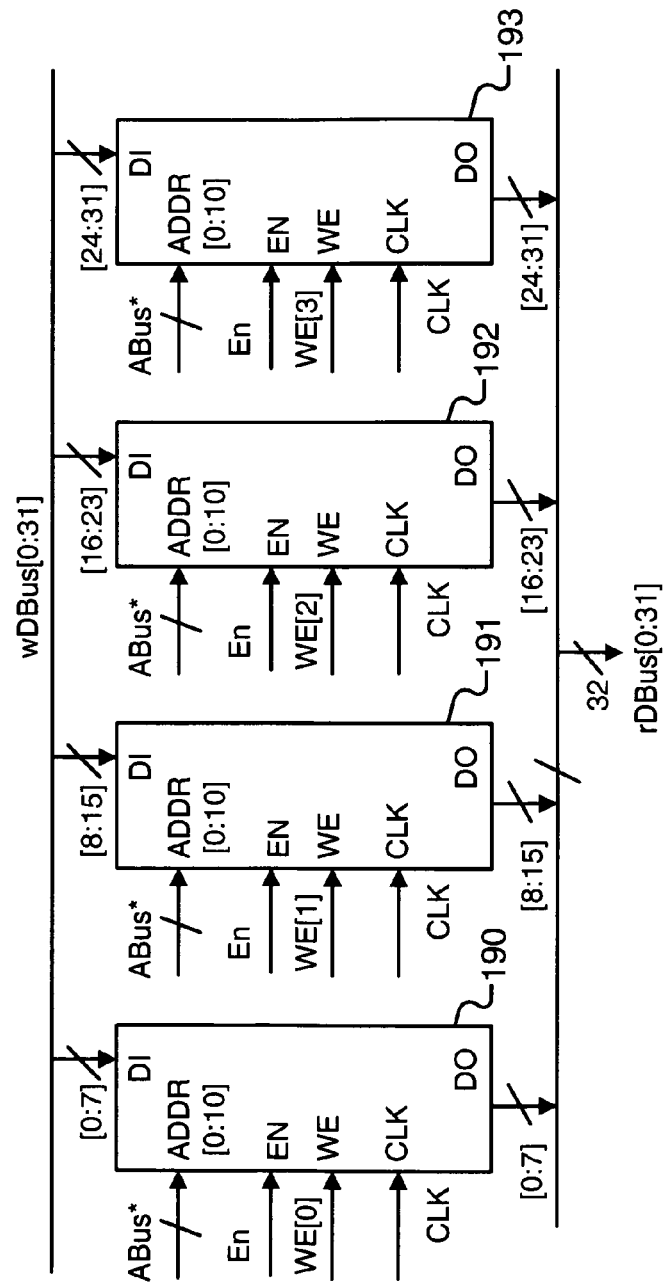

Turning now to the data side, a block diagram of a data side 180 of a data processing system is shown in FIG. 5. It contains a processor subsystem 182 that includes a processor core 184 and a DSOCM controller 186. Processor core 184 and DSOCM controller 186 communicate with each other through a set of signals, such as C_dABus, C_dWrDBus, and D_cRdDBus. DSOCM controller 186 generates another set of signals for controlling the operation of its associated memory devices (such as memory devices 190-193). Examples of the signals are ABus, wDBus, WE, EN, and rDbus. In one embodiment, DSOCM controller 186 has a data width of 32 bits.

The bus C_dABus is an address bus that the processor core uses to deliver the address to DSOCM controller 186 to get the data located in the data-side on-chip memory address space. The bus C_dWrDBus is a data bus that the processor core uses to deliver data to DSOCM controller 186 to write the data into the data-side on-chip memory address space. The bus D_cRdDBus is the data bus that DSOCM controller 186 uses to transport the read data to the processor core from the BRAMs. The bus ABus is the address bus that DSOCM controller 186 uses to get data from the on-chip memory. The bus wDBus is the data bus that DSOCM controller 186 uses to write data to on-chip memory. The signal WE[0:3] is the write enable signals for byte write. The signal EN is the signal for enabling BRAMs for reading or writing. The bus rDbus is the read data bus that delivers data from BRAMs to DSOCM controller 186.

In an exemplary implementation, the BRAMs are set as single port 2Kx8 bits memory devices. They are connected in parallel so as to be compatible with the interface of DSOCM controller 186 (e.g., 32-bit word in this implementation). Four BRAMs are used because the exemplary DSOCM interface supports byte writes. In the present invention, only these BRAMs (with a total of 8K Bytes) are needed to test the entire address space of DSOCM controller 186 (e.g., 16 MBytes).

In FIG. 5, the CLK inputs of BRAMs 190-193 is connected to the data processing system in a similar way as that described in connection with FIG. 2. The EN output of DSOCM controller 186 is connected to the EN inputs of BRAMs 190-193. The four WE outputs of DSOCM controller 186 are connected to the respective WE inputs of BRAMs 190-193. The 32 data lines of wDBus output of DSOCM controller 186 are divided into four sets ([0:7], [8:15], [16:23] and [24:31]) and are connected to the respective DI inputs of BRAMs 190-193. These lines are used to pre-load data into the BRAMs during an initialization process. The DO outputs of BRAMs 190-193 are combined to provide a 32-bit bus for testing.

In order to test the DSOCM controller, each address line bit needs to be toggled to verify the proper functioning of the address lines. In one embodiment, data is pre-loaded into the BRAMs in the selected address word locations where each address line bit is to be exercised. Preferably, the locations are selected such that the next higher significant bit of address line is toggled. The data value in each location is preferably unique. The pre-loading of data words into the BRAMs is performed by a software program when the integrated circuit is initialized (for example, during configuration when a FPGA is powered-up). The test program writes a known data byte or halfword into those word locations. The data word in those locations now consists of bytes from pre-loaded data word and bytes from data that is written in. Upon read back, the bytes from pre-loaded data word create a "signature" to indicate that the read back data word comes from the correct location. The written bytes indicate that the address bit line being exercised sends the data to the correct address location. As a result, the test program can check the data word and can certify that the address line bits are exercised correctly.

Figure 6A:
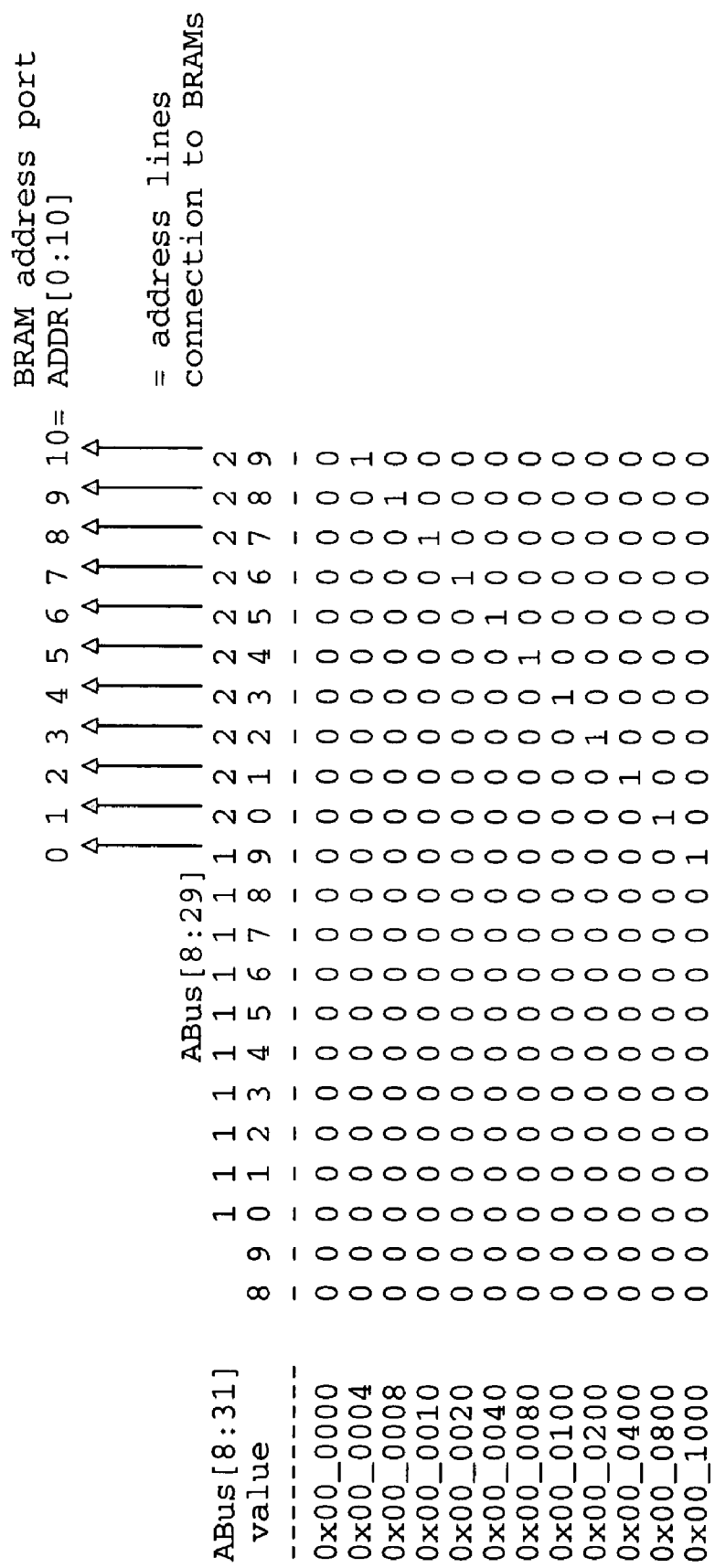
FIGS. 6A and 6B show the relationship between the address lines of the system shown in FIG. 5.
Figure 6B:
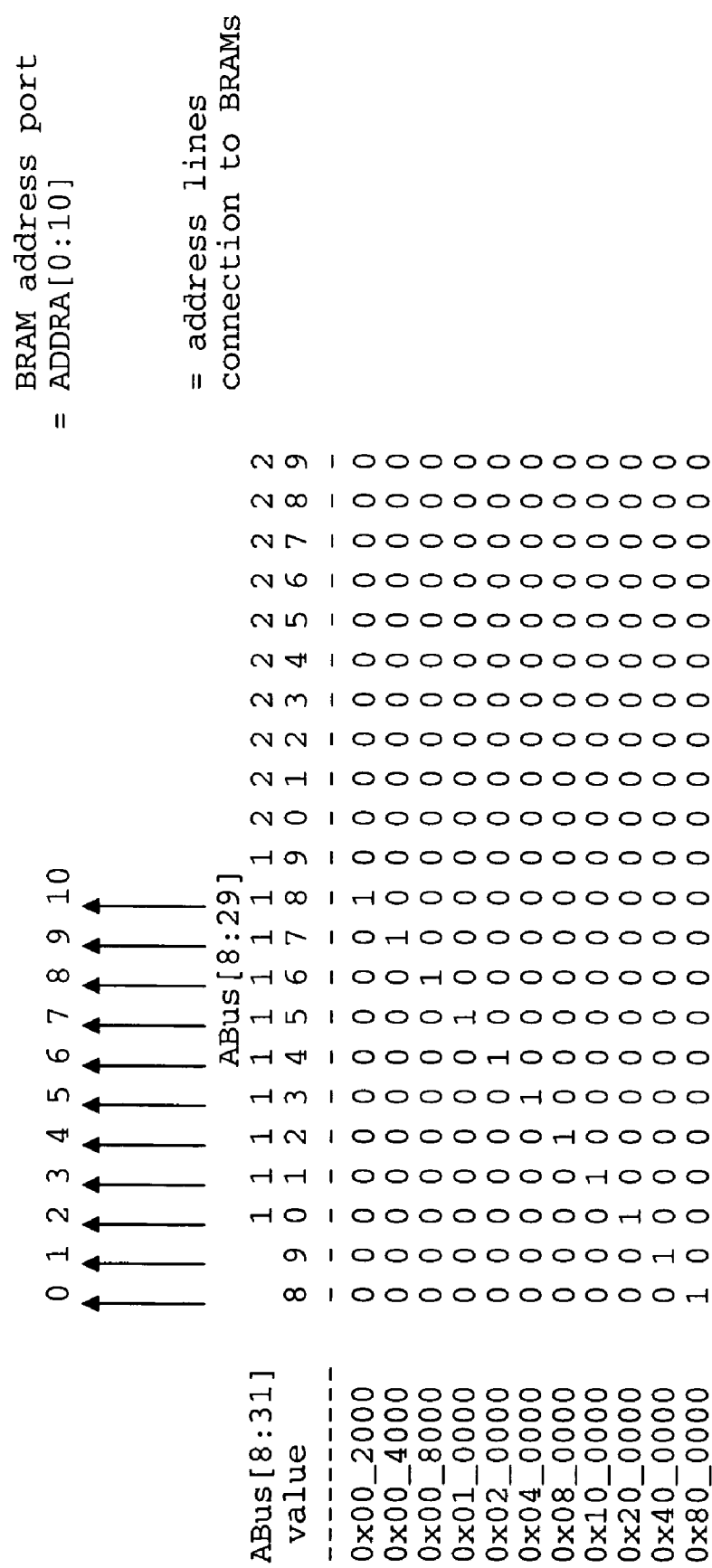

In FIG. 5, Each BRAM uses 11 address line bits ADDR[0: 10] because they are configured as 2K words deep. To test each address line bit of ABus[8:29], these address lines are connected to BRAMs in two distinct ways and two separate test programs are applied. The connection is shown in FIGS. 6A and 6B. To test address line bits of ABus[19:29] in the first test, these address lines are connected to BRAM address port ADDR[0:10]. To test address line bits of ABus[8:18] in the second test, these address lines are connected to BRAM address port ADDR[0:10]. Note that not all address line bits exercised by the test program is shown in the figures. Only those that are used for illustration are shown.

A table is provided to illustrate the relationship between the connection of ADDR (shown as ABus* in FIG. 5) and the test programs:

Test 1: ABus[19:29]; and

Test 2: ABus[8:18].

If data-side 180 is implemented in a FPGA, the connection between the ADDR port of the BRAMs and the ABus bus of the DSOCM can be configured separately in each of the two tests. As a result, there is no need to use extra circuitry in the connection. If the implementation is conducted on a non-programmable device, switching circuit elements (e.g., multiplexers) can be used to implement the different connections.

FIG. 7 shows an exemplary memory map and data values of address locations where data is pre-loaded in the BRAMs when the integrated circuit is initialized and when data is written into and read from. These operations are performed by the test program.

In the exemplary examples described in FIGS. 2 and 5, the address lines [0:7] are completely inside processor subsystems 152 and 182, and they are not delivered to the BRAMs by the OCM controller. Consequently, these address lines are not tested in these examples. In a system where all the address lines are available for connection with memory devices, these address lines should also be tested.

It can be seen from the above description that a novel routing method has been disclosed. Those having skill in the relevant arts of the invention will now perceive various modifications and additions which may be made as a result of the disclosure herein. Accordingly, all such modifications and additions are deemed to be within the scope of the invention, which is to be limited only by the appended claims and their equivalents.

The invention claimed is:

1. A system for testing a set of address lines, said set of address lines having at least a first group and a second group, said system comprising:
    at least one memory device having a set of address inputs that are connected to said first group and said second group at different times; and
    a processor subsystem coupled to said memory device, the processor subsystem being programmed to:
    pre-load a first set of predetermined data into a first set of locations of said at least one memory device and write a second set of predetermined data into a second set of locations of said at least one memory device that is associated with said first set of locations, said first and said second sets of locations being chosen such that each of said set of address inputs is exercised in accessing said first and said second sets of locations; and
    read said first and said second sets of locations to determine if they are correctly accessed by using said first and said second sets of predetermined data.

2. The system of claim 1 wherein said at least one memory device is a single port memory device.

3. The system of claim 1 wherein said processor subsystem is further programmed to compare values read from said first and said second sets of locations to said first and said second sets of predetermined data, and if they are the same, signal that said first and said second groups of address lines are functioning properly.

4. The system of claim 3 wherein said at least one memory device is implemented using a field programmable gate array.

5. The system of claim 4 wherein said programming of said processor subsystem is defined during configuration of said field programmable gate array.

6. The system of claim 1 wherein each member of said first set of predetermined data is unique.

7. A data processing system comprising:
    a processor core;
    a memory controller coupled to the processor core for controlling a set of address lines, said set of address lines having at least a first group and a second group;
    at least one memory device having a set of address inputs that are connected to said first group and said second group at different times;
    the processor core being programmed to,
    pre-load a first set of predetermined data into a first set of locations of said at least one memory device and write a second set of predetermined data into a second set of locations of said at least one memory device that is associated with said first set of locations, said first and said second sets of locations being chosen such that each of said set of address inputs is exercised in accessing said first and said second sets of locations; and
    read said first and said second sets of locations to determine if they are correctly accessed by using said first and said second sets of predetermined data.

8. The system of claim 7 wherein said at least one memory device is a single port memory device.

9. The system of claim 7 wherein each member of said first set of predetermined data is unique.

10. The system of claim 7 wherein said processor core is further programmed to compare values read from said first and said second sets of locations to said first and said second sets of predetermined data, and if they are the same, signal that said first and said second groups of address lines are functioning properly.

11. The system of claim 7 wherein said at least one memory device is implemented using a field programmable gate-array.

12. The system of claim 11 wherein said programming of said processor core is defined during configuration of said field programmable gate array.

13. The system of claim 7, wherein said second set of locations is associated with said first set of locations by a branch instruction.

* * * * *